United States Patent [19]

Cain et al.

[11] Patent Number: 5,356,451
[45] Date of Patent: Oct. 18, 1994

[54] METHOD AND APPARATUS FOR VAPORIZATION OF LIQUID REACTANTS

[75] Inventors: Michael B. Cain; Michael S. Dobbins, both of Corning, N.Y.

[73] Assignee: Corning Incorporated, Corning, N.Y.

[21] Appl. No.: 169,037

[22] Filed: Dec. 20, 1993

[51] Int. Cl.$^5$ .................................. C03B 37/023
[52] U.S. Cl. ..................................... 65/414; 65/532; 65/60.52; 65/17.4; 65/417; 118/726
[58] Field of Search ............... 65/3.11, 62.52, 3.12, 65/18.2, 60.52; 118/726

[56] References Cited

U.S. PATENT DOCUMENTS

| | | | |
|---|---|---|---|
| 4,314,837 | 2/1982 | Blankenship | 65/3.12 |
| 4,529,427 | 7/1985 | French | 65/3.12 |
| 4,938,789 | 7/1990 | Tsuchiya et al. | 65/3.12 X |
| 5,043,002 | 8/1991 | Dobbins et al. | 65/3.12 |
| 5,059,231 | 10/1991 | Ackermann et al. | 65/3.12 |
| 5,078,092 | 1/1992 | Antos et al. | 118/726 |
| 5,090,985 | 2/1992 | Soubeyrand | 65/60.56 |

Primary Examiner—Robert L. Lindsay
Attorney, Agent, or Firm—W. J. Simmons, Jr.

[57] ABSTRACT

Disclosed is a method and apparatus for providing reactant vapors to a utilization site. The apparatus includes a vaporization chamber enclosed by top and bottom walls, side walls and first and second end walls. The first end wall is elevated with respect to the second end wall. The reactant is supplied in liquid form to a flow distributor that delivers the liquid to that portion of the bottom wall near the first end wall. The angle with which the bottom wall is inclined with respect to horizontal is sufficient to cause the liquid to flow down the bottom wall at a rate sufficient to form a film, the thickness of which is smaller than that thickness which would support a bubble during heating of the film. The surface is heated to a temperature greater than the boiling point of the liquid, thereby converting the liquid reactant to a vapor that is delivered to the vapor utilization site.

16 Claims, 4 Drawing Sheets

METHOD AND APPARATUS FOR VAPORIZATION OF LIQUID REACTANTS

BACKGROUND OF THE INVENTION

The present invention relates to a vaporizer for delivering vaporized reactants to a reaction zone, and to a method of using such vaporizer.

Glass particle deposition processes have been used to form preforms from which optical fibers can be drawn. In the glass particle deposition process, the vapor mixture is reacted at a burner or within a glass substrate tube to form a coating of glass particles which is subsequently fused to form a high quality glass. In order to enhance the fatigue resistance or other mechanical properties of the optical fiber, or to effect a change in the index of refraction of the vapor deposited optical fiber preform, the chemical composition of the vapors which are reacted to form the deposited glass particles may be varied. For the sake of simplicity, only burner-type deposition systems will be discussed. Typically $SiCl_4$ or organosilioxane (octamethylcyclotetrasiloxane) is the primary vapor constituent. One or more additional vapors can be supplied to the oxidation/flame hydrolysis burner, the one or more vapors comprising chemical precursors of dopants whose presence affects the properties of the glass being formed.

In order to form a preform having generally consistent properties, and to assure an even distribution of the glass particles, it is necessary to supply the burner with a substantially constant flow of vaporized source material entrained in a carrier gas, such as $O_2$, i.e. pressure spikes should be minimized. Moreover, the rate of change of flow of vapor should accurately track any change in vapor demand initiated by the control system. Accordingly, systems have been devised for controlling the carrier gas flow and the rate at which source material is vaporized and entrained into the carrier gas.

The reactant flow is typically measured in the vapor state. Alternative systems have been disclosed which meter the reactants in their liquid state, and thereafter vaporize or nebulize the reactants prior to their introduction into an oxidation/flame hydrolysis burner.

In one system wherein liquid reactants are metered in the liquid state, the metered reactants are supplied to a flash evaporation chamber. Oxygen is also supplied to the chamber and intermixed with the vaporized reactants prior to delivery to the vapor deposition means. Although the liquid reactants are delivered to the chamber in controlled amounts, the liquid is sprayed onto a heated surface whereby immediate vaporization occurs, thereby creating nucleate or film boiling. The vaporized output from this system slowly responds to the input liquid flow since the chamber volume needs to be large to permit the liquid to be sprayed onto or toward the heated plate. Thus, a step change in the flow of boron-containing reactant, for example, would not produce a step change in the amount of boron-containing particles deposited on the preform.

Another known reactant vaporizer employs a chamber including a cylindrical inner wall; reactants are fed to one end of the cylindrical chamber, and a thin film is formed by rotating blades. Since the blade shaft passes through an end wall of the chamber, the chamber is subject to leaking at the seal. Film thickness is essentially determined by the gap between the blades and the inner wall. It would appear that part of the film would not be thin since there would be a thick portion (like a wave) adjacent the stirrer until axial flow made the film thinner than the gap between the blade and inner wall. Liquid running down the blade could form droplets that could be carried in the vapor stream. Faster blade rotation would worsen the effect. Another disadvantage of this type of vaporizer is slow response time, the volume within the cylindrical chamber being relatively large.

Another cylindrical vaporizer includes a cylindrical heating rod that is situated within a cavity located within a chamber cylinder. The relative sizes of the inner heating rod and the surface that forms the cylindrical cavity is such that an annular gap exists between them. Liquid reactant flows onto the inner rod at one end of the vaporizer, the thickness of the reactant liquid film being mechanically constrained by the gap thickness. The temperature of the heating element is maintained below the temperature where nucleate or film boiling of the liquid occurs. It is difficult to increase flow in such a device. Vapor is generated at the leading edge of film, which is the only exposed surface. If flow of the liquid reactant were increased, and input power were increased to maintain a constant temperature, a point would be reached at which vapor would form at the surface of the inner cylindrical heater, i.e. liquid would flash off the surface, so that the vaporizer operation would become unstable. Vapor forming in the liquid behind the front edge would cause pressure spikes. Even when this type of vaporizer is operating well, pressure fluctuations of 2 to 3 mm Hg can occur. Moreover, this device is geometrically constrained to operate at very low flow rates.

It is therefore and object of the present invention to provide an improved system for delivering precise, controlled amounts of reactants at high flow rates to a glass particle deposition apparatus. Another object is to provide a vaporization chamber in which the flow of unvaporized liquid is undisturbed by vapor exiting the chamber. A further object is to provide a vaporization chamber that is simple in construction and has no moving parts. Yet another object is to provide a vaporizer the output vapor flow of which quickly and accurately tracks the input flow of reactant liquid.

SUMMARY OF THE INVENTION

Briefly, the present invention relates to a method of providing reactant vapors to a utilization site. A liquid reactant is distributed across the upper portion of an inclined surface, the shape of which can be planar, conical or the like. The surface is inclined with respect to horizontal at such an angle that the liquid flows down the surface at a rate sufficient to form a film, the thickness of which is smaller than that thickness which would support a bubble during boiling of an amount of the liquid of sufficient thickness to support bubbles. The surface is heated to a temperature greater than the boiling point of the liquid, thereby converting the liquid reactant to a vapor. The vaporized liquid is then delivered to a vapor utilization site. The angle of inclination of the surface, the physical characteristics of the liquid and the temperature to which the surface is heated are such that the film preferably does not extend to the bottom of the lower portion of the surface.

In one embodiment in which the surface is planar, the means for distributing comprises a liquid reservoir and a flow distributer disposed between the reservoir and the surface, the flow distributer having a plurality of channels spaced along its length.

In an embodiment in which the surface is a conically-shaped, the liquid reactant can be flowed onto the small diameter apex end of the cone, whereby it flows down the outer surface thereof. Alternatively, the surface could be the inner surface of a conical member, and the liquid reactant could be flowed through an orifice at the top of the conical member and onto its inner surface.

The invention also relates to the apparatus for performing the above-described method.

DESCRIPTION OF THE PREFERRED EMBODIMENTS

The drawings are not intended to indicate scale or relative proportions of the elements shown therein.

Figure 1:
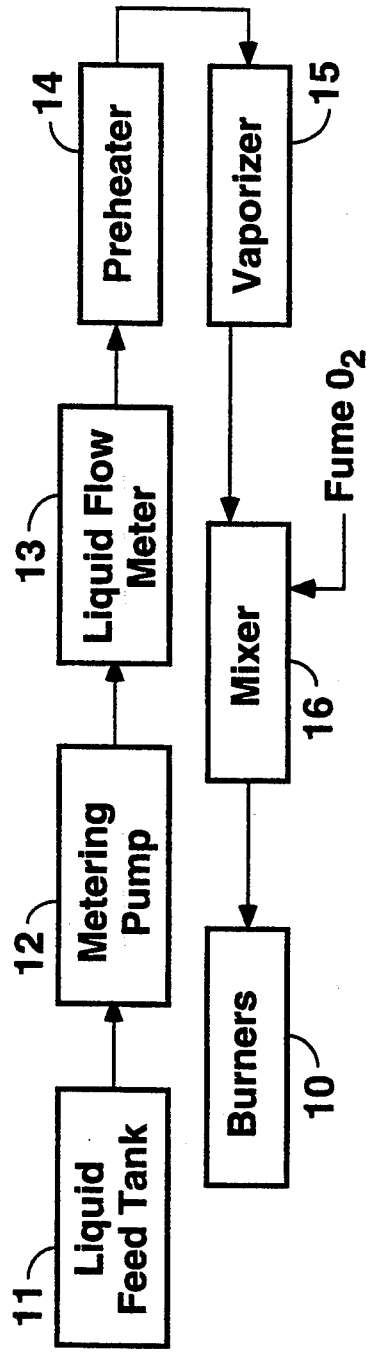
FIG. 1 is a block diagram of a vapor delivery system constructed in accordance with the present invention.

FIG. 1 illustrates a system for delivering reactant gases and vapors to one or more burners 10. A reactant liquid such as organosilioxane, SiCl$_4$ or the like is stored in feed tank 11. A metering pump 12 transfers reactant liquid from tank 11 to preheater 14. Liquid flow meter 13 monitors the bulk liquid flow and in turn a signal is transmitted to a controller which increases or decreases the rotation rate of the metering pump. The liquid delivered from liquid mass flow meter 13 is under sufficient pressure to prevent volitilization of the liquid in the preheater. The preheater is optionally employed to increase the temperature of the metered liquid, thereby reducing the power load on vaporizer 15. Oxygen and vaporized reactant liquid are fed to a mixer 16 which delivers the resultant mixture to burners 10. The burners are also conventionally supplied with inner shield gas, outer shield gas, and a mixture of CH$_4$ and oxygen for the flame. A typical burner is disclosed in U.S. Pat. No. 4,165,223.

Figure 2:
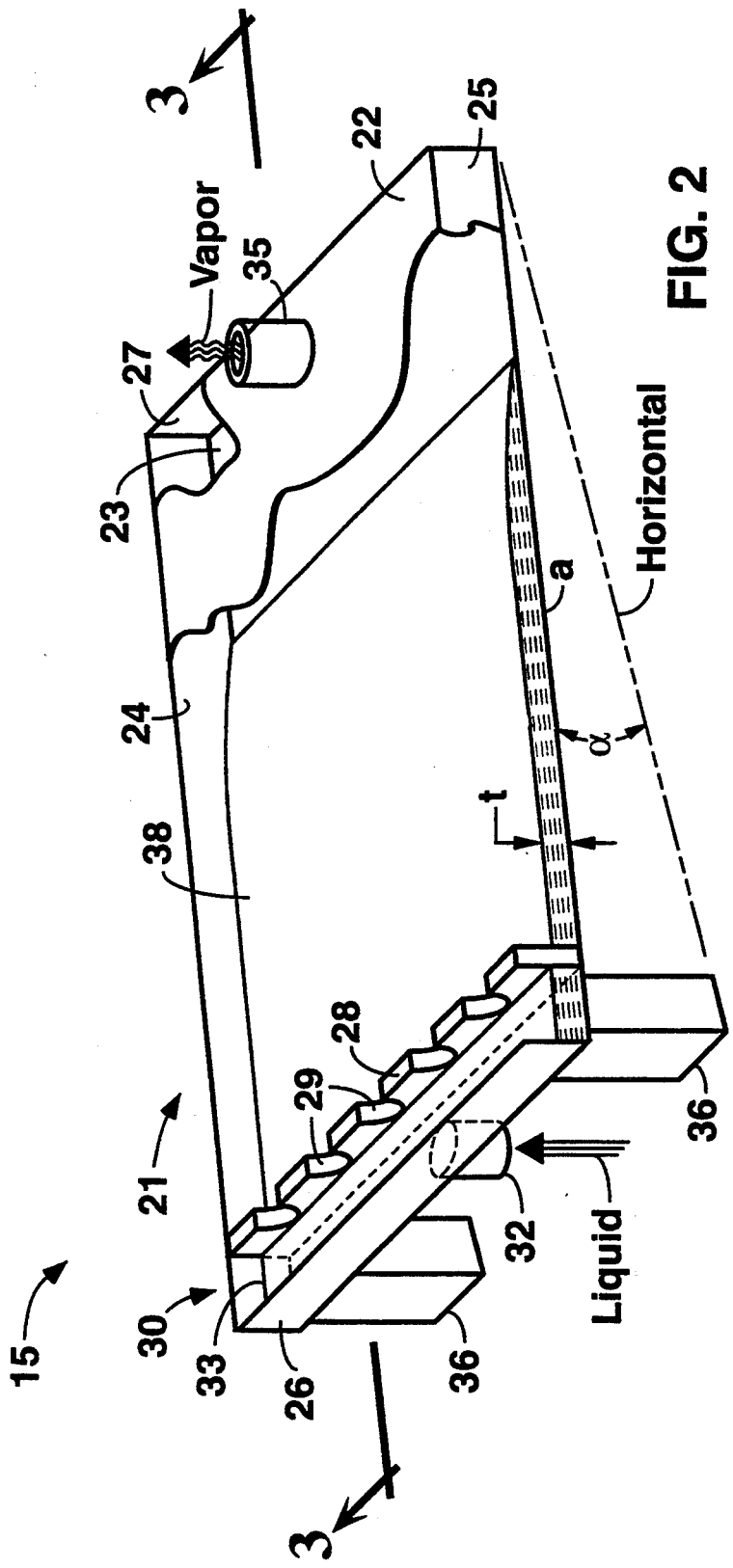
FIG. 2 is an oblique schematic diagram of the vaporizer of FIG. 1.

Referring now to FIG. 2 vaporizer 15 comprises a vaporization chamber 21 enclosed by top wall 22, bottom wall 23, side walls 24 and 25 and end walls 26 and 27. A flow distributor 28 having a plurality of U-shaped channels 29 is located near end wall 26, the space between flow distributor 28 and the end wall 26 constituting a liquid reservoir 30. Liquid input orifice 32 is situated at the bottom of reservoir 30, and vapor output orifice 35 is situated in top wall 22 near end wall 27.

Reactant liquid is fed into orifice 32. When the level of the liquid rises above dashed line 33, it begins to flow through channels 29 and is evenly distributed across chamber 21 between walls 24 and 25. Support means 36 elevates one end of the vaporizer so that it is oriented at an angle $\alpha$ with respect to horizontal, and the liquid flows toward end wall 27. A film 38 is formed, the maximum thickness t of which depends upon parameters such as surface tension, density, viscosity and the angle $\alpha$. Unlike those vaporizers which confine the film within a gap between two parallel surfaces, film 38 is such that the vapor and liquid phases of the reactant are separated by a surface that is parallel to or nearly parallel to the bottom surface 23. Film thickness t must be sufficiently thin that bubbles cannot form within liquid film 38. Thickness t is about equal to the diameter d of a bubble that would form if the liquid were boiled in a vat where bubble formation would not be inhibited by film thickness. Bubble diameter d in meters is given by $$d = \pi \frac{\sigma g_c}{g(\rho_L - \rho_v)}^{\frac{1}{2}} \quad (1)$$

where $\sigma$ is the surface tension of the liquid in N/m, g is the acceleration of gravity (9.81 m/sec$^2$), $\rho_L$ is the liquid phase density in kg/m$^3$, $\rho_v$ is the vapor phase density in kg/m$^3$), and $g_c$ is equal to 1 kg/N·s$^2$.

If film thickness were too great, vaporization could occur at the interface between the film and heated bottom wall 23. Such occurrences could cause undesired pressure spikes in the vapor stream delivered by the device.

Heat transfers from surface 21 across the film, and vaporization can occur at the entire free surface of film 38. Operating temperature, which depends on the reactant material, must be sufficiently high to cause vaporization at the operating pressure that will be present at maximum fluid flow rate. Thus, if not too wide a range of flows occurs, the temperature can be maintained constant throughout the run. However, as reactant flow increases, operating pressure increases, and higher temperature is needed to achieve vaporization. Therefore, if flow varies over a wide range, vaporizer temperature can be slightly ramped with increased flow.

Temperature can be measured at various points in the process. For example, the temperature at the center of top surface 22 or the temperature of the vapor emanating from orifice 35 could be measured. The upper temperature is not limited by bubble formation in film 38. Rather, it is limited by such factors as the decomposition temperature of the reactant liquid and the temperature at which liquid would vaporize so rapidly that it would not reach surface 21.

It is noted that a thin region of chamber 21 extends over the entire film, whereby no region of the film is constrained at its top surface by mechanical means. System response is proportional to the amount of free space within chamber 21 that is not occupied by film 38. It should therefore be obvious that the volume of chamber 21 located over film 38 cannot be too large, or system response time will be degraded.

The vaporizer is designed so that liquid never reaches end 27. Setting the angle is one of the design variables that affects this. The angle is preferably shallow enough that the residence time of the liquid in contact with the heated surface allows transfer of sufficient heat to vaporize the liquid. The flow rate of reactant liquid can be varied considerably in a given device without exceeding these guidelines. However, if flow rate were to vary greatly from design value, the vaporizer should be redesigned so that it possesses a larger or smaller film-forming area, as required.

Figure 3:
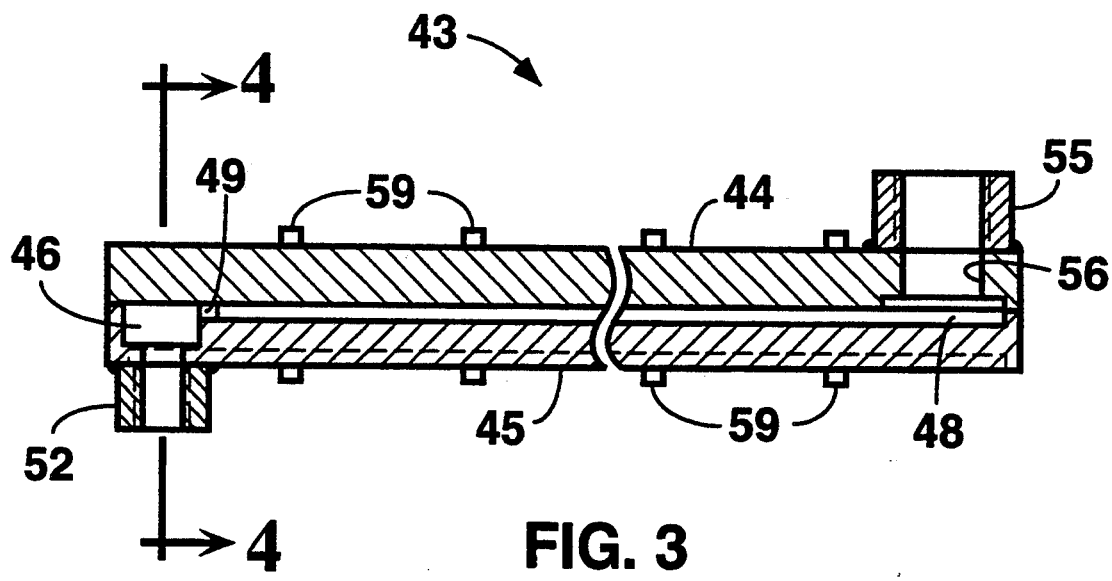
FIG. 3 is a side elevational view, in partial cross-section, of the vaporizer.
Figure 4:
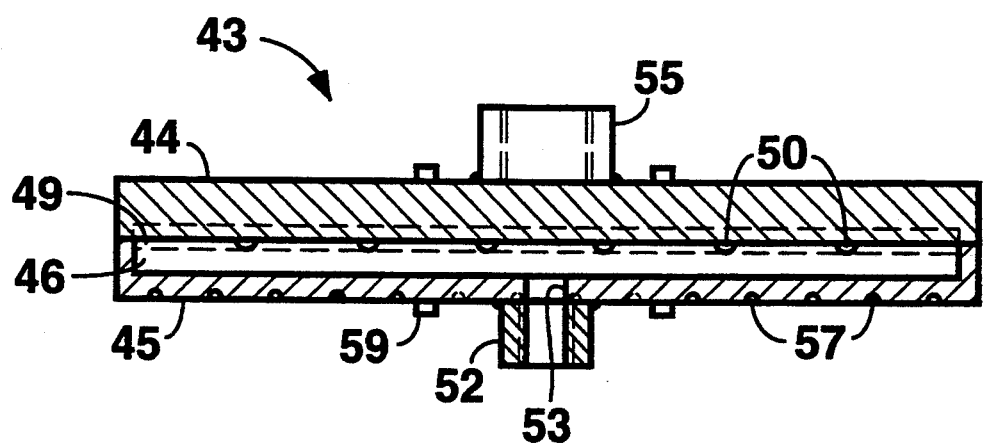
FIG. 4 is a cross-sectional view taken along lines 4—4 of FIG. 3.
Figure 5:
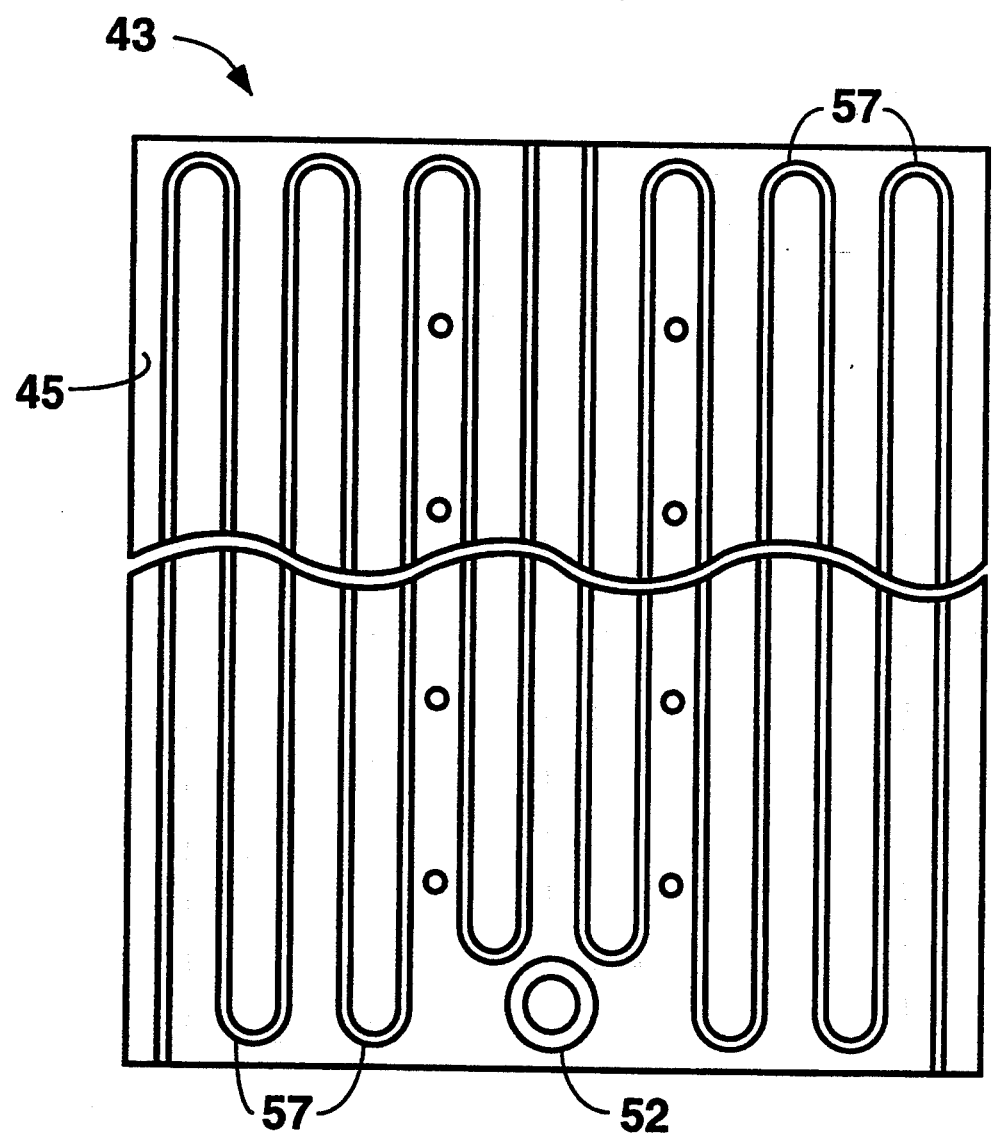
FIG. 5 is a view of the bottom plate of the vaporizer.

The embodiment of FIG. 2 can be constructed in accordance with FIGS. 3, 4 and 5. Vaporizer 43 is formed of upper plate 44 and lower plate 45. At one end of lower plate 45 is machined a liquid reservoir 46. Machined to a lesser depth in the bottom plate is a chamber 48 which is separated from reservoir 46 by a wall 49 into which channels 50 are machined. Liquid inlet pipe 52 is affixed to bottom plate 45 in alignment with bore 53 by means such as welding. Vapor outlet pipe 55 is affixed to top plate 44 in alignment with bore 56. Grooves 57, which are machined in bottom plate 45, receive a heating element (not shown). Because of the pressure generated within the vaporizer, it may be necessary to provide means for preventing the warping of one or both of the plates. For example, if aluminum is used to form the plates, rods 59 could be inserted through and affixed to the top and bottom plates to provide added strength for high pressure operation. The rods could be welded to the plates, or they could have nuts threaded onto them. If the plates were formed of stainless steel or if they were thicker or provided with ribs, the bolts would not be necessary.

A vaporizer was fabricated in accordance with the embodiment shown in FIGS. 3–5. The system was employed to feed organosilioxane vapor to a plurality of burners for the purpose of depositing cladding glass particles onto an optical waveguide preform.

Top and bottom plates 44 and 45 were formed of aluminum; they were secured together by aluminum rods. Chamber 48 was 23.3 inches (59 cm) long (the dimension along grooves 57), 13 inches (33 cm) wide and 0.15 inch (0.4 cm) high. Liquid reservoir 46 was 1 inch (2.5 cm) long, 13 inches (33 cm) wide and 0.5 inch (1.3 cm) high. Each of the six channels 50 was semicircularly-shaped and had a cross-sectional area of 0.035 square inch (0.23 cm$^2$).

During deposition, a flow of 200 g/min organosiloxane was initially required; due to the increasing surface area of the preform as its diameter increased, the flow of organosilioxane was ramped to 400 g/min at the end of the deposition process. The liquid organosilioxane was heated to 120° C. in preheater 14 and was then fed into pipe 52. After filling reservoir 46, the liquid flowed through channels 50. Vaporizer 43 was maintained at an angle of 15° with respect to horizontal, thereby causing the liquid to flow in a thin film toward vapor outlet pipe 55. The maximum allowable thickness t for organosilioxane, as determined by equation (1) is about 3 mm (0.118 inch). The computed film thickness in this example for a flow of 400 g/min is 0.15 mm. The vapor exiting the vaporizer was maintained at a constant temperature of 225° C., which is 50° C. above its boiling point of 175° C. Feedback from the temperature sensor increased the power to the heater as flow rate increased to maintain the vapor temperature substantially constant. This operating temperature is sufficiently high that vaporization occurs at the highest flow rate.

Pressure fluctuations measured at the vaporizer output were too small to detect, i.e. they were less than 1 inch water (1.87 mm Hg). The described vaporizer was also operated at temperatures as low as 190° C. with similar performance.

Figure 6:
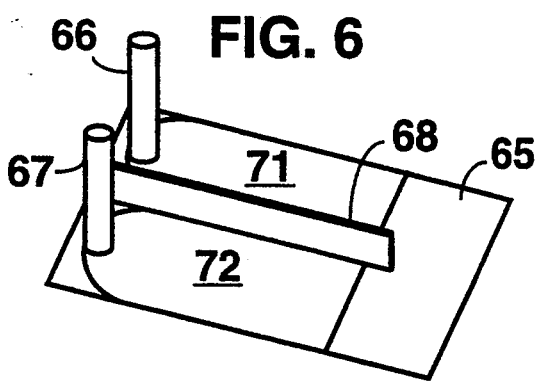
FIG. 6 is an oblique schematic diagram of a further embodiment of the invention.

Vaporizer 64 of FIG. 6 is similar to that of FIG. 2 except for the means for distributing flow across the bottom wall 65. Two or more fluid delivery pipes 66 and 67 are located at one end of bottom wall 65. Vaporizer 64 would be provided with top, side and end walls of the type shown in FIG. 2. A partition 68 is optionally employed to separate films 71 and 72. Pipes 66 and 67 can deliver a single liquid or a plurality of different liquids to bottom wall 65.

If two different liquids were delivered, for example, a first liquid could be the precursor for the base glass, and a second liquid could be the precursor for a dopant glass, in which case partition 68 could be located off center so that the first liquid occupied the larger area of bottom wall 65.

Figure 7:
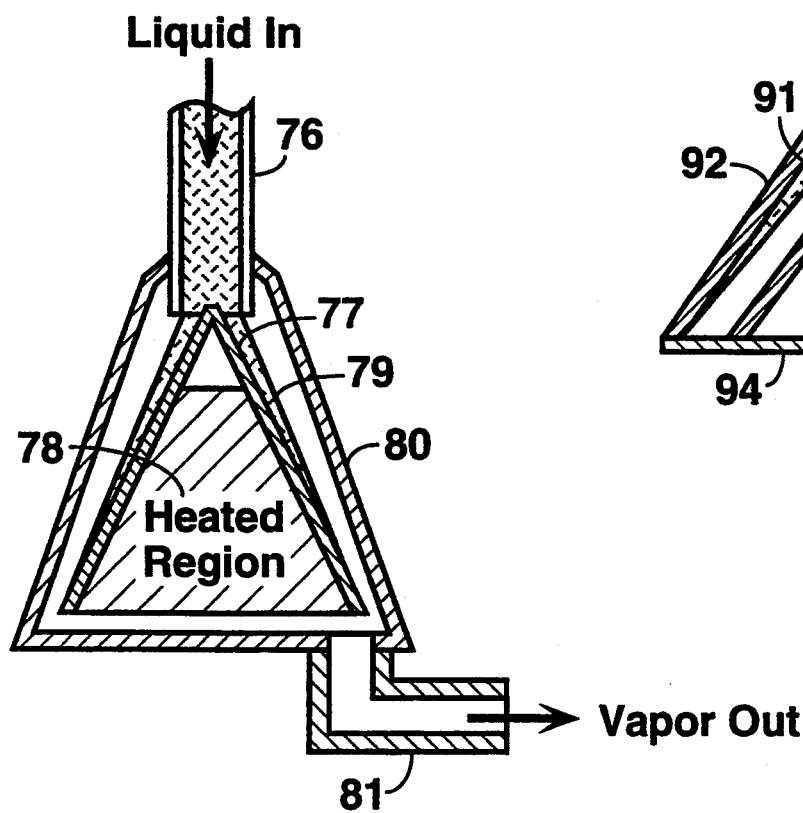
FIGS. 7, 8 and 9 are schematic diagrams further embodiments.
Figure 9:
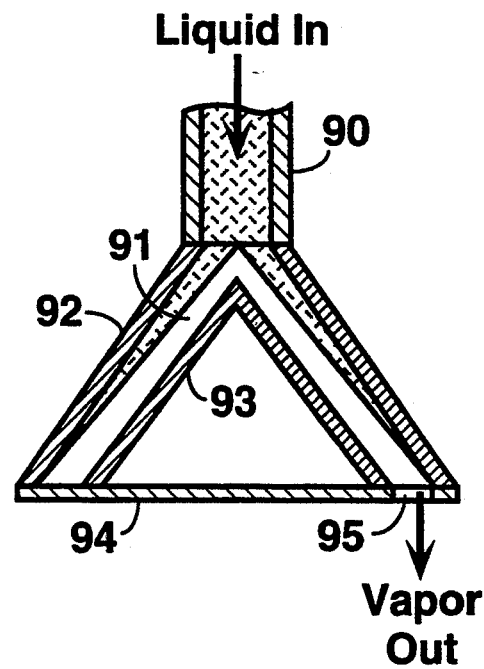
Figure 8:
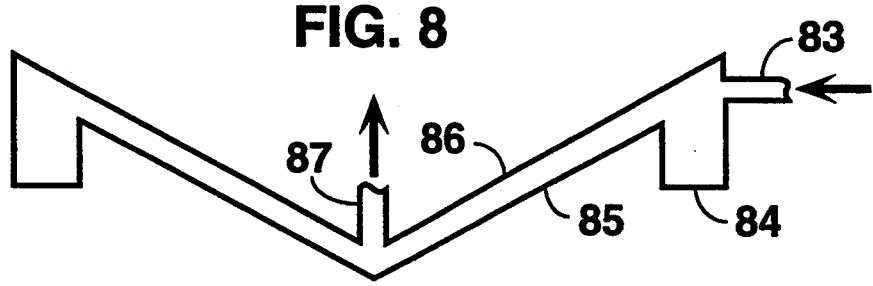

FIGS. 7–9 show conical surfaces on which the thin film can form.

In FIG. 7 reactant liquid is delivered through pipe 76 onto surface 77 of the conically-shaped bottom plate. The liquid impinges upon the top of surface 77 and flows down the conical surface, evenly distributed about the vertical axis of the cone. The lower portion of the conical bottom structure that is indicated as being heated region 78 is contacted by heating means such as heating tape. Therefore, thin film 79, which flows most of the distance to the lower region of bottom surface 77, is vaporized as described above. The vapor is confined by conical top plate 80 and is withdrawn from the vaporization chamber by output pipe 81.

In FIG. 8 reactant liquid is delivered through pipe 83 into a reservoir 84, and from there, it flows around the upper periphery of conically-shaped bottom surface 86. The outlet side of the reservoir could be provided with channels as shown in FIG. 2 to more evenly distribute the flow. The liquid flows downwardly from the periphery of surface 85 and is evenly distributed about the vertical axis of the cone. The bottom surface is heated, whereby the thin film is vaporized as described above. The vapor is confined by top surface 86 and is withdrawn from the vaporization chamber by output pipe 87.

In FIG. 9 reactant liquid flows from pipe 90 into chamber 91 that is formed between conical plates 92 and 93. Surface tension causes it to adhere to the bottom of heated plate 92 where it forms a thin film that is vaporized as described above. The vapor is confined by plates 92, 93 and 94 and is withdrawn from vaporization chamber 91 through orifice 95.

We claim:

1. A method of providing reactant vapors to make an optical fiber preform by decomposing said reactant vapors to form glass particles, comprising flowing a liquid reactant onto an inclined surface having an upper portion elevated with respect to a lower portion, said liquid being flowed onto said surface such that it is distributed across said upper portion, said surface being inclined with respect to horizontal at an angle sufficient to cause said liquid to flow down said surface at a rate sufficient to form a film, the thickness of which is smaller than that thickness which would support a bubble during boiling of an amount of said liquid of sufficient thickness to support bubbles, heating said surface to a temperature greater than the boiling point of said liquid, thereby converting said liquid reactant to a vapor, and delivering the vaporized liquid to a vapor utilization site to form said optical fiber preform.

2. A method in accordance with claim 1 wherein the angle of inclination of said surface, the physical characteristics of said liquid and the temperature to which said surface is heated are such that said film does not extend to the bottom of said lower portion of said surface.

3. A method in accordance with claim 1 wherein the step of flowing comprises flowing said liquid onto a planar surface.

4. A method in accordance with claim 1 wherein the step of flowing comprises flowing said liquid onto a conical surface.

5. A method in accordance with claim 4 wherein the step of flowing comprises flowing said liquid onto a conical surface comprises flowing said liquid onto the top surface of a conical member.

6. A method in accordance with claim 4 wherein the step of flowing comprises flowing said liquid onto a conical surface comprises flowing said liquid onto the bottom surface of a conical member.

7. A method in accordance with claim 1 wherein the step of supplying comprises supplying a preheated liquid.

8. A method in accordance with claim 1 wherein the thickness of said film is less than d meters, wherein d is defined by the equation $$d = \pi \frac{\sigma g_c}{g(\rho_L - \rho_V)}^{\frac{1}{2}}$$

where $\sigma$ is the surface tension of the liquid in N/m, g is the acceleration of gravity (9.81 m/sec$^2$), $\rho_L$ is the liquid phase density in kg/m$^3$, $\rho_v$ is the vapor phase density in kg/m$^3$, and $g_c$ is equal to 1 kg/N·s$^2$.

9. A method in accordance with claim 1 wherein the exposed surface of said film that is opposite said inclined surface is substantially parallel to said inclined surface over more than one-half the area of the exposed surface of said film.

10. A vaporizer for vaporizing reactant materials in the formation of optical fiber preforms comprising
a vaporizer surface having an upper portion and a lower portion,
means for supplying a reactant in liquid form,
means for distributing said liquid reactant across said upper portion,
means for elevating said upper portion of said surface with respect to said lower portion of said surface such that said surface is inclined an angle with respect to horizontal that is sufficient to cause said liquid to flow down said surface toward said lower vaporizer surface portion at such a rate that a there is formed a film, the thickness of which is smaller than that thickness which would support a bubble during boiling of an amount of said liquid of sufficient thickness to support bubbles,
means for heating said vaporizer surface to a temperature greater than the boiling point of said liquid, thereby converting said liquid reactant to a vapor,
cover means cooperating with said vaporizer surface to confine said vapor, said cover means being sufficiently spaced from said vaporizer surface that said film has a free surface opposite said vaporizer surface, and
means for delivering the vaporized liquid to a vapor utilization site with means to form an optical fiber preform from said vaporized liquid.

11. A vaporizer in accordance with claim 10 wherein said surface is planar.

12. A vaporizer in accordance with claim 11 wherein said means for distributing comprises a liquid reservoir and a flow distributer disposed between said reservoir and said surface, said flow distributer having a plurality of channels spaced along its length.

13. A vaporizer in accordance with claim 11 wherein said means for distributing comprises a plurality of pipes spaced along said first surface portion.

14. A vaporizer in accordance with claim 10 wherein said surface is conical.

15. A vaporizer in accordance with claim 10 wherein said surface is a conical surface of a hollow conical member, the lower region of said surface being located at the base of said conical member, said means for distributing comprising means for flowing said liquid reactant onto the outer surface of said hollow conical member.

16. A vaporizer in accordance with claim 10 wherein said surface is a conical surface of a hollow conical member, the lower region of said surface being located at the base of said conical member, said means for distributing comprising means for flowing said liquid reactant onto the inner surface of said hollow conical member.

* * * * *